US006738008B1

(12) United States Patent
Liu et al.

(10) Patent No.: US 6,738,008 B1
(45) Date of Patent: May 18, 2004

(54) MATCHING NETWORK HYBRID ELECTRO-MAGNETIC COMPATIBILITY ABSORBER

(75) Inventors: Kefeng Liu, Round Rock, TX (US); Bryan H. Sayler, Cedar Park, TX (US); Vicente Rodríquez-Pereyra, Austin, TX (US)

(73) Assignee: ETS-Lindgren L.P., Cedar Park, TX (US)

( * ) Notice: Subject to any disclaimer, the term of this patent is extended or adjusted under 35 U.S.C. 154(b) by 0 days.

(21) Appl. No.: 09/746,963

(22) Filed: Dec. 21, 2000

(51) Int. Cl.$^7$ ............................................. H01Q 17/00
(52) U.S. Cl. .......................................................... 342/4
(58) Field of Search ......................................... 342/1–4

(56) References Cited

U.S. PATENT DOCUMENTS 5,323,160 A * 6/1994 Kim et al. ...................... 342/1
5,617,095 A * 4/1997 Kim et al. ...................... 342/1

FOREIGN PATENT DOCUMENTS

| EP | 0530038 | 3/1993 |
| FR | 2610780 | 12/1988 |

OTHER PUBLICATIONS

Ellam, T., "An Update on the Design and Synthesis of Compact Absorber for EMC Chamber Applications," Electromagnetic Compatibility, 1994. Symposium Record. Compatibility in the Loop, IEEE International Symposium on, pp. 408–412, Aug. 1994.*

Mayer et al. "High Frequency Broadband Absorption Structures" Electromagnetic Compatibility, 1998. Symposium Record. Compatibility in the Loop, IEEE International Symposium on, pp. 894–899, Aug. 1998.*

Pues et al. "Design of Modern EMC Chambers for Radiated EMC Testing up to 18 GHz", Electromagnetic Compatibility, 1997. Symposium Record. Compatibility in the Loop, IEEE International Symposium on, pp. 72–77, Aug. 1997.*

(List continued on next page.)

Primary Examiner—Ian J. Lobo
(74) Attorney, Agent, or Firm—Christopher J. Rourk; Akin Gump Strauss Hauer & Feld, LLP

(57) ABSTRACT

A matching network hybrid electro-magnetic compatibility (EMC) absorber. A substrate of any number of materials serves as the frame on which partial coatings are placed. Design parameters governing the substrate and other parameters governing the coating control the electrical properties of the matching network hybrid EMC absorber. By performing partial and/or full coating, the physical shape and mechanical properties of the matching network hybrid EMC absorber may be de-coupled from the electrical properties. A designer modifies and controls the electrical performance of an electro-magnetic test system by special-tailoring a matching network hybrid EMC absorber. An electro-magnetic wave to ensure that a majority of the electro-magnetic wave is absorbed into a lossy, absorber material mounted on the walls of a test chamber in the frequency range from 20–500 MHz. Typically, the absorber material includes ferrite tiles, and the present invention ensures that a majority of the electro-magnetic illumination within a test chamber is properly absorbed by these ferrite tiles. The matching network hybrid EMC absorber operates as a broadband matching network at a low frequency range. Using of a computer model and numerical optimization, the lossy films of the matching network can also be designed so that it absorbs majority of the RF energy before it reaches the flat surface of ferrite tile in the frequency range of 500 MHz to 40 GHz. The combined design method presents a new cost effective method to manufacture hybrid EMC absorbers in a extremely broadband frequency range from 20 MHz to 40 GHz.

11 Claims, 6 Drawing Sheets

OTHER PUBLICATIONS

Michielssen et al. "Design of Lightweight, Broad–Band Microwave Absorbers Using Genetic Algorithms" IEEE Transactions on Microwave Theory and Techniques, vol. 41, No. 67 Jun./Jul. 1993.*

Chung Yeon–Choon et al., "Broadband Electromagnetic Absorber With Ferrite/Ferrite Hybrid Structure", Electronics Letters, IEEE Stevnage, GB, vol. 35, No. 18; Sep. 2, 1999, pp. 1526–1527, XP006012654.

Shimada, K., et al., "Fully Compact Anechoic Chamber Using the Pyramidal Ferrite Absorber For Immunity Test," 2000 IEEE International Symposium on Electromagnetic Compatibility. EMC. Symposium Record, Washington, DC, Aug. 21–25, 2000; International Symposium on Electromagnetic Compatibility, New York, NY: IEEE, US, vol. 1 of 2, Aug. 21, 2000, pp. 225–230, XP001077062.

Haala, J. et al., "Analysis and Optimization of Anechoic Chambers Equipped with Ferrite and Hybrid Absorbers Using FIT–FD," International Conference on Antennas and Propagation, London, GB, vol. 436, Part 1, Apr. 14, 1997, pp. 1130–1135, XP001077051, Fig. 5.

Ishinko, K. et al., "Realization of Compact Semi– and Fully Anechoic Chambers Using A New Developed Composite Absorber," Electromagnetic Compatibility, Nov. 1994. Symposium Record. Compatiblity in the Loop., IEEE International Symposium in Chicago, IL, Aug. 22–26, 1994, New York, NY, IEEE, Aug. 22, 1994, pp. 413–418, XP010133044, Figure 1.

* cited by examiner

MATCHING NETWORK HYBRID ELECTRO-MAGNETIC COMPATIBILITY ABSORBER

BACKGROUND

1. Technical Field

The present invention relates generally to radio frequency (RF) absorbers operable for use in electro-magnetic compatibility (EMC) testing applications; and, more particularly, it relates to a matching network hybrid EMC absorber for use in treating walls and ceiling of a shielded anechoic (non-reflective) EMC test enclosure.

2. Related Art

RF absorbers are commonly used in treating metallic surfaces of a shielded enclosure to produces an ideal test environment for conducting antenna, and radar cross-section measurements in the frequency range of several hundred Mega-Hertz (MHz) up to 100 Giga-Hertz (GHz) in the past four decades. More recently, similar technology has also been employed to conduct RF measurements for EMC compliance of intentional and unintentional radiators (such as mobile communications devices and digital equipment) from as low as 20 MHz up to 40 GHz. A special class of RF absorbers has been developed to accommodate the low frequency test accuracy required by the EMC test specifications developed by the Federal Communications Commission (FCC) and other International EMC Regulatory bodies. This special class of RF absorbers is often referred to generally as EMC absorbers due to its unique design features that differ from the higher frequency absorbers.

Conventional EMC absorbers, installed on the metallic surfaces of EMC test facilities, are typically covered entirely with an absorber material. Common approached dealing with conventional EMC absorber technology includes modification of the shape of the absorber. The first usable type of EMC absorber is of a dielectric material (polyurethane foam impregnated with carbon film through its volumetric entirety) only having a thickness ranging from 2.4 meters to 3.6 meters. Designs and developments have included the varying of the physical size of absorbers as well as varying the physical shape of absorbers in an attempt to accommodate low-frequency absorbing performance required by EMC test applications. In general, the shape of absorbers may be classified as having a substantially pyramid type of shape. Sometimes, the apex of the pyramid type of shape is severed, leaving a flat top that is parallel with the base. This last variation in the shape of an absorber, having a severed apex of the pyramid, has proven to be one of the largest and most divergent changes in absorber design in the past several years.

The predominant approach among designers of absorbers has been focused on the altering of the size and shape of the absorber to accommodate various test needs. In addition, there has been development directed towards using different sub-layers of various materials on which an absorber is laid in an effort to enhance absorber and test system performance. In these conventional approaches, an entirety of an absorber is impregnated, or at least all of at least one side of the absorber. In some applications, these sub-layers constitute dielectric materials, and sometimes the various sub-layers each have different dielectric constants. Due to enormous size of the absorber and dimensions of the shielded enclosure to accommodate the absorbers and required working space, the large dielectric absorbers are often found to be too costly to be used to build an EMC test facility.

In the 1990's, another type of EMC absorbers using sintered magnetic lossy material in the form of ferrite tile or ferrite grid tiles was introduced to build EMC test facilities. The ferrite and grid tiles are especially effective at lower frequency range. In addition, the physical thickness of the magnetic absorbers can be as thin as several millimeters to a few centimeters. These advantages enable EMC test facilities to be constructed much smaller. However, due to its flat surface, its higher frequency absorbing performance is severely limited to less than 2 GHz. Furthermore, since most ferrite absorbing materials are manufactured using a 10 cm×10 cm footprint, the presence of air gaps between ferrite tiles on a wall surface substantially degrades its RF absorbing performance at the low frequency end. These two limitations effectively restrict the use of ferrite absorbers to function alone as premium performing RF absorber to construct an EMC test facility in a cost effective manner.

A third type of EMC absorber combining the ferrite magnetic absorber and foam dielectric absorbers was introduced to circumvent the disadvantages of the previous two types of EMC absorbers. This hybrid type of RF absorber is typically designed to have dielectric absorber in front of the ferrite tile absorbers. When designed properly, the dielectric and magnetic absorbers work jointly to help improve the low frequency end. At higher frequency (above 1 GHz), the dielectric absorber, normally shaped like a pyramid, absorbs almost all of the RF energy before it reaches the ferrite material. The hybrid EMC absorbers with premium absorbing performance are typically of a height from approximately 1.0 to 1.8 meters. However, due to the high cost of volumetric contents of its dielectric absorber and ferrite tiles, hybrid absorbers still cost rather high.

Further limitations and disadvantages of conventional and traditional systems will becomes apparent to one of skill in the art through comparison of such systems with the present invention as set forth in the remainder of the present application with reference to the drawings.

SUMMARY OF THE INVENTION

One aspect of the present invention allows the development of a low-cost broadband matching network in front of the ferrite tile absorber so that the ferrite tile absorber with air gaps can be very effective at low frequency range from approximately 20 MHz to 500 MHz. With the help of numerical model, the matching network and tile absorbers still maintain the overall premium performance from 500 MHz to 1 GHz. The lossy contents of the matching network may also be properly designed so that it absorbs a majority of the RF energy before it reaches the flat surface of ferrite tile in the frequency range of approximately 1 to 40 GHz.

Various aspects of the present invention can be found in a matching network hybrid electro-magnetic compatibility absorber to provide improved radio frequency absorbing performance in a frequency range of approximately 20 MHz to approximately 500 MHz. The matching network hybrid electro-magnetic compatibility absorber includes a big element, a small element that is located beneath the big element, the big element comprises a big element surface, the small element comprises a small element surface, a big element coating that covers a predetermined portion of the big element surface, and a small element coating that covers a predetermined portion of the small element surface.

In certain embodiments of the invention, the matching network hybrid electro-magnetic compatibility absorber has a substantially pyramid-like shape, and the predetermined portion of the big element surface includes less than an entirety of the big element surface, and the predetermined portion of the small element surface includes less than an entirety of the small element surface. At least one of the big element coating and the small element coating has a substantially tear drop shape. At least one of the big element coating and the small element coating has a predetermined thickness. The big element and the small element are separated by a predetermined distance. The big element has at least two surfaces, and the at least two surfaces are separated by a distance having a predetermined thickness. The big element coating is made of a first material, and the small element coating is made of a second material. The matching network hybrid electro-magnetic compatibility absorber also includes at least one additional big element coating that covers at least one additional predetermined portion of the big element surface. The at least one additional predetermined portion of the big element surface being less than an entirety of the big element surface.

Various other aspects of the present invention can be found in a matching network hybrid electro-magnetic compatibility absorber to provide improved radio frequency absorbing performance in a frequency range of approximately 20 MHz to approximately 500 MHz. The matching network hybrid electro-magnetic compatibility absorber includes a layer having a surface, and a coating that covers a predetermined portion of the surface.

In certain embodiments of the invention, the coating has a predetermined shape. The layer includes at least one additional surface, and at least one additional coating covers a predetermined portion of the at least one additional surface. The predetermined portion of the at least one additional surface includes less than an entirety of the least one additional surface. The matching network hybrid electro-magnetic compatibility absorber also includes at least one additional layer. The at least one additional layer includes at least one additional surface. The matching network hybrid electro-magnetic compatibility absorber also includes at least one additional coating covers a predetermined portion of the at least one additional surface. The predetermined portion of the at least one additional surface includes less than an entirety of the least one additional surface. The matching network hybrid electro-magnetic compatibility absorber also includes at least two elements, and at least one of the two elements includes the layer. The layer includes at least one additional surface, and a distance between the surface and the at least one additional surface is of a predetermined thickness. The coating has a predetermined thickness, and the predetermined portion of the surface includes less than an entirety of the surface.

Various other aspects of the present invention can be found in a matching network hybrid electro-magnetic compatibility absorber. The matching network hybrid electro-magnetic compatibility absorber includes an absorber having a surface having a coating. The coating includes at least one of a coating type, a coating shape, a coating thickness, and a coating placement. At least one of the coating type, the coating shape, the coating thickness, and the coating placement is varied as a design parameter to permit absorption of radio frequency energy in a frequency range extending from approximately 500 MHz to approximately 40 GHz.

In certain embodiments of the invention, the coating shape has a substantially tear drop shape. The coating covers an entirety of the surface. Alternatively, the coating covers less than an entirety of the surface. The surface includes at least one additional coating that includes at least one of at least one additional coating type, at least one additional coating shape, at least one additional coating thickness, and at least one additional coating placement.

Other aspects, advantages and novel features of the present invention will become apparent from the following detailed description of the invention when considered in conjunction with the accompanying drawings.

BRIEF DESCRIPTION OF THE DRAWINGS

A better understanding of the present invention can be obtained when the following detailed description of various exemplary embodiments are considered in conjunction with the following drawings.

DETAILED DESCRIPTION OF THE INVENTION

The present invention is operable to generate a matching network hybrid electro-magnetic compatibility (EMC) absorber that is capable to create a broadband matching network at a relatively low frequency range from approximately 20 MHz to 500 MHz. A matching network hybrid EMC absorber, built in accordance with the present invention, is operable to perform as a coordinated component in the whole absorber assembly. By properly adjusting the lossy loading films of the broadband matching network through the use of a computer model, the absorber assembly can be designed to also absorb majority of the RF energy before it reaches the flat surface of a ferrite tile in the frequency range of approximately 1 to 40 GHz. When this hybrid EMC absorber is applied to the walls and ceiling of many test facilities, the matching network hybrid EMC absorber allows a designer to ensure that electro-magnetic illumination on the treated surfaces is absorbed very effectively by this special matching network hybrid EMC absorber. The coating of an absorber-like material, in various shapes, over any type of substrates is used to control the electrical properties of the matching network hybrid EMC absorber. In certain embodiments of the invention, the substrate is a material having, in terms of electrical and magnetic properties, substantially air-like characteristics.

Figure 1:
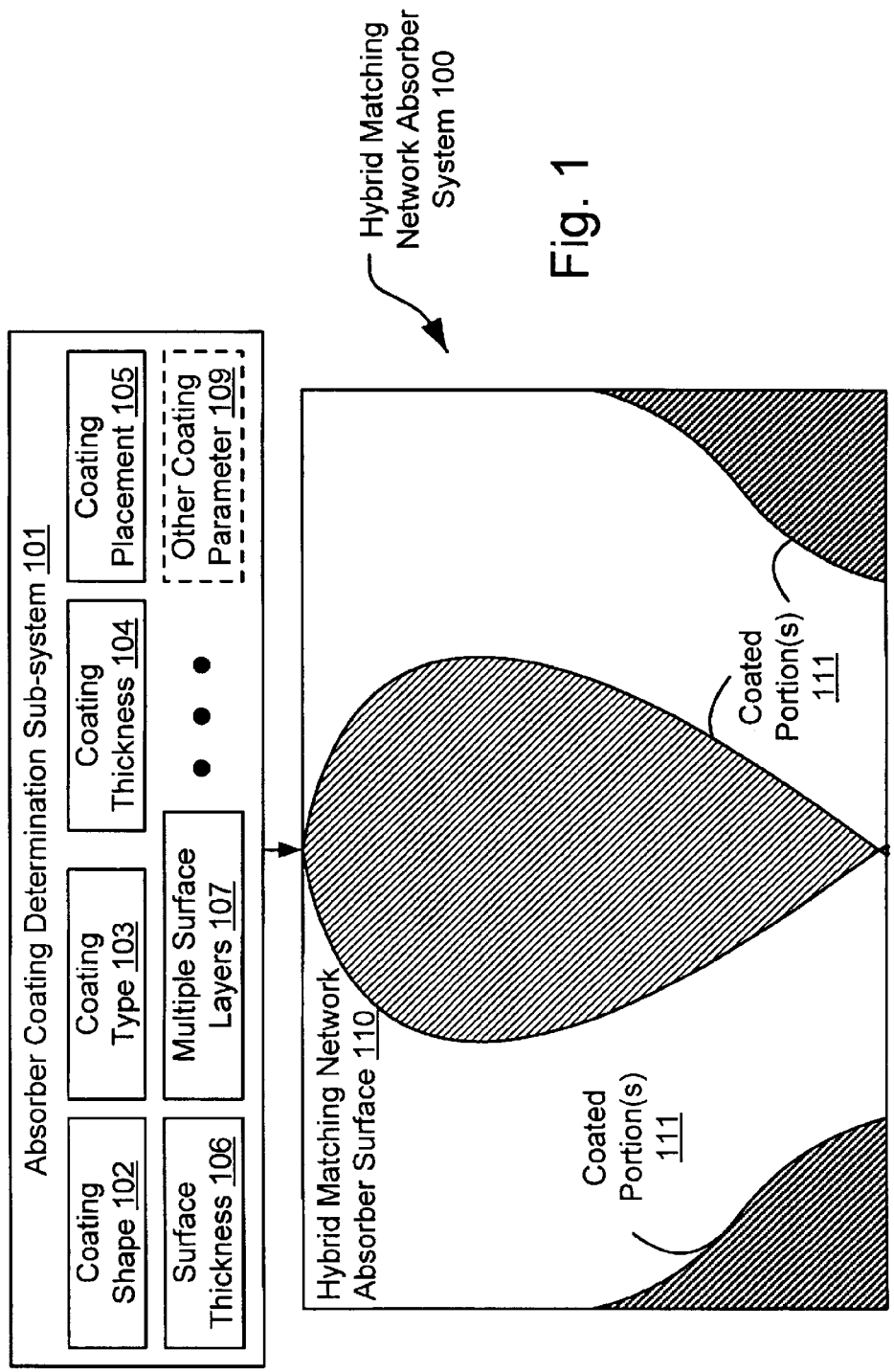
FIG. 1 is a system diagram illustrating an embodiment of a matching network hybrid EMC absorber system built in accordance with the present invention.

FIG. 1 is a system diagram illustrating an embodiment of a matching network hybrid EMC absorber system 100 built in accordance with the present invention. The matching network hybrid EMC absorber system 100 includes an absorber coating determination sub-system 101 that is used to determine the coating to be used on a matching network hybrid EMC absorber. As specifically shown for illustration in the FIG. 1, the absorber coating determination sub-system 101 is used to determine the coating on a matching network hybrid EMC absorber surface 110. The matching network hybrid EMC absorber surface 110 is exemplary of any surface, frontside, backside, or any other surface of a matching network hybrid EMC absorber as will be understood in the various Figures showing alternative embodiments of the invention. Any number of coating parameters are used by the absorber coating determination sub-system 101 including a coating shape 102, a coating type 103, a coating thickness 104, a coating placement 105, a surface thickness 106, multiple surface layers 107 or any other coating parameter 109.

There are coated portion(s) 111 on the matching network hybrid EMC absorber surface 110. If desired, there may be as few as no coated portion(s) 111 or coatings on an entirety of the matching network hybrid EMC absorber surface 110 constitutes a coated portion(s) 111 in various embodiments of the invention. In the exemplary embodiment of the FIG. 1 shows one coated portion in a substantially tear drop shape. In addition, other coated portion(s) 111 are located at the lower corners of the matching network hybrid EMC absorber surface 110. Any number of variations of coated portion(s) 111 are used in various embodiments of the invention. One aspect of the present invention, when compared to conventional absorber technologies, is the fact that the present invention is operable to accommodate coating of only portions of the matching network hybrid EMC absorber surface 110. As mentioned elsewhere, conventional absorber technologies focus primarily on coating of all of an absorber surface.

The various parameters used by the absorber coating determination sub-system 101 are all used to control the electrical properties of an absorber. For example, the shape of a partial coating on the matching network hybrid EMC absorber surface 110 affects the electrical properties of the absorber. From certain perspectives, the implementation of partial coating on an absorber surface allows the de-coupling of the mechanical or physical properties of the absorber from the electrical properties of the absorber. A designer is no longer limited to the mere availability of the mechanical and physical shape of an absorber to control the electrical properties of the absorber for use in an absorber system. Moreover, the coating type 103 that is used will also affect the electrical properties of an absorber. For example, as shown in the FIG. 1, different coatings may be used on different portions of the matching network hybrid EMC absorber surface 110. The coating type 103 of the tear drop coated portion 111 differs from the coating type 103 of the coated portions 111 shown at the lower corners of the matching network hybrid EMC absorber surface 110. Also, the coating thickness 104 of certain coating materials will affect the electrical properties of the absorber as well. Clearly, the coating placement 105 will modify the electrical properties of the absorber. The surface thickness 106 and the multiple surface layers 107 will perhaps be more easily understood in conjunction with the following Figures. The present invention provides for matching network hybrid EMC absorbers having various components, each having sometimes multiple surface layers 107 where one or both sides of one of the multiple surface layers 107 may be coated. The surface thickness 106 of the multiple surface layers 107 is yet another parameter that may be varied and controlled by a designer to control the electrical properties of an absorber. In addition, the any other coating parameter 109 is also operable to control the electrical properties of an absorber as well.

Figure 2:
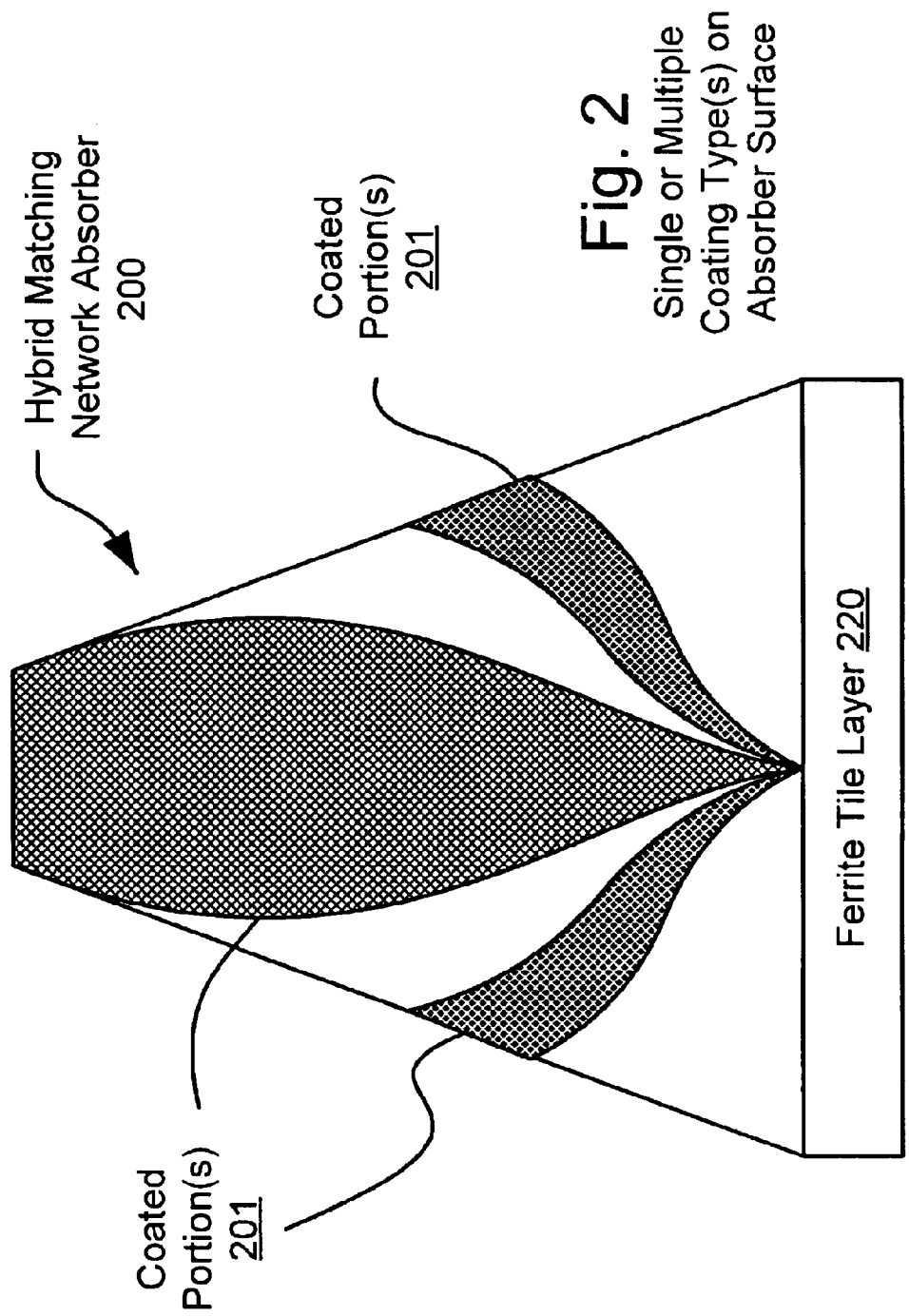
FIG. 2 is a system diagram illustrating an embodiment of a matching network hybrid EMC absorber built in accordance with the present invention.

FIG. 2 is a system diagram illustrating an embodiment of a matching network hybrid EMC absorber 200 built in accordance with the present invention. The matching network hybrid EMC absorber 200 is placed upon a ferrite tile layer 220. The ferrite tile layer 220 is, in certain embodiments of the invention, a tile layer of the interior of a test chamber used for electro-magnetic testing of any number of devices. The matching network hybrid EMC absorber 200 is substantially of a triangular or pyramid shape with a flat top. The matching network hybrid EMC absorber 200 includes a number of coated portion(s) 201. As mentioned above in the discussion of the FIG. 1 is equally applicable here as well. For example, there may be as few as no coated portion(s) 201 or coatings on an entirety of the matching network hybrid EMC absorber 200 constitutes a coated portion(s) 201 in various embodiments of the invention. The FIG. 2 shows the availability of single or multiple coating portion (s) on an absorber surface. The exemplary embodiment of the FIG. 2 shows one coated portion in a substantially tear drop shape. In addition, other coated portion(s) 201 are in other shapes besides a tear drop shape. Similarly as shown by the coated portion(s) 111 in the FIG. 1, the coated portion(s) 201 may be made using different coating materials.

Figure 3:
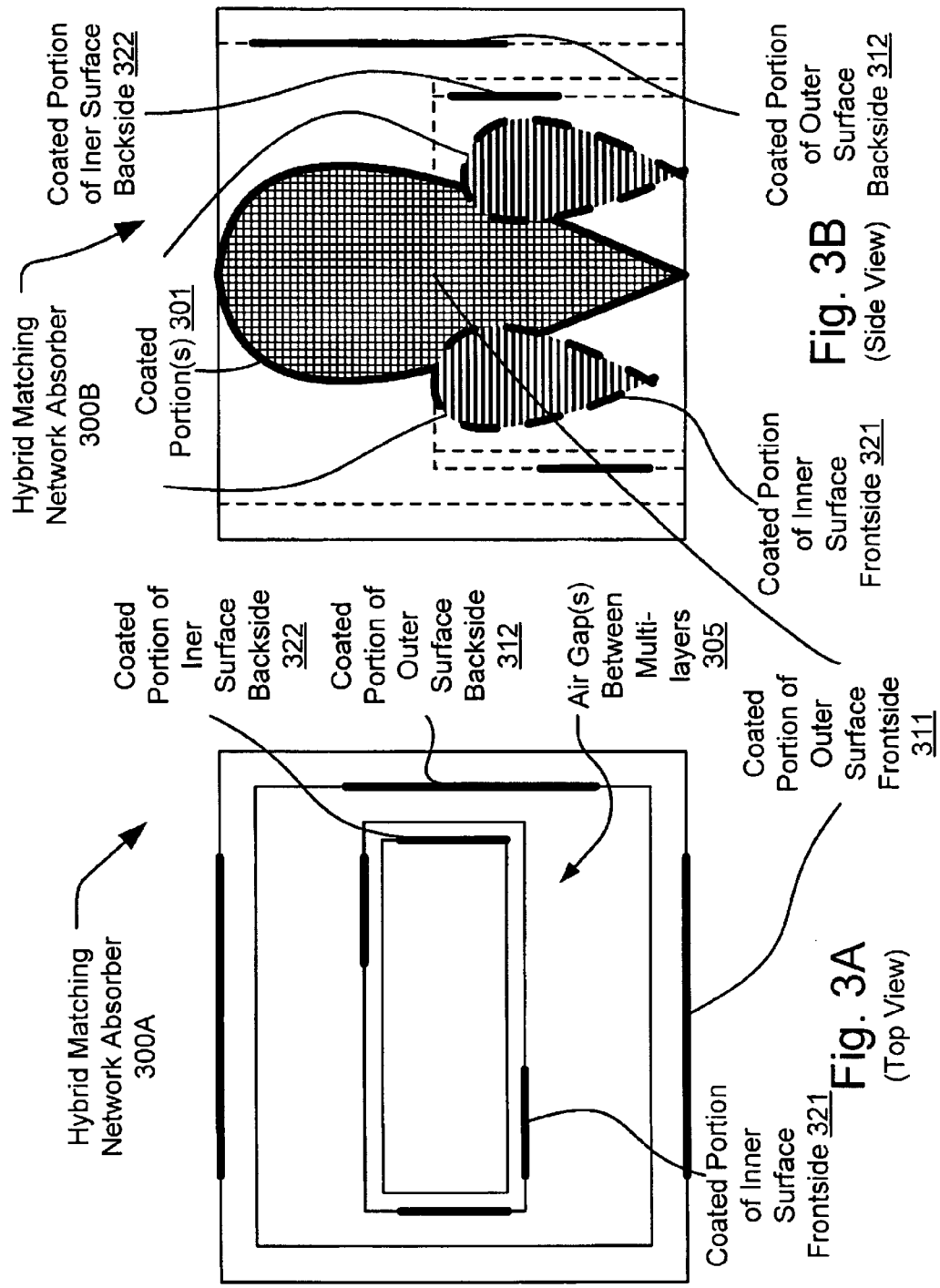
FIG. 3A is a system diagram illustrating another embodiment of a matching network hybrid EMC absorber built in accordance with the present invention from a top view.
FIG. 3B is a system diagram illustrating a side view perspective of the matching network hybrid EMC absorber of the FIG. 3A.

FIG. 3A is a system diagram illustrating another embodiment of a matching network hybrid EMC absorber 300A built in accordance with the present invention from a top view. The matching network hybrid EMC absorber 300A is shown as being a substrate having two different layers, each having a different surface thickness. Each of the multiple layers of the matching network hybrid EMC absorber 300A has a frontside and a backside surface that may be coated. There is particularly an outer surface and an inner surface of the matching network hybrid EMC absorber 300A. For example, the matching network hybrid EMC absorber 300A, as shown in the FIG. 3A, has a coated portion of an outer surface frontside 311 and a coated portion of an outer surface backside 312. In addition, the matching network hybrid EMC absorber 300A has a coated portion of an inner surface frontside 321 and a coated portion of an inner surface backside 322. The thickness of each of the multiple layers of the matching network hybrid EMC absorber 300A is one design parameter, and the distance of air gap(s) between the multiple layers 305 is yet another design parameter. The varying of the thickness of the various multiple layer surfaces will affect the electrical properties of the matching network hybrid EMC absorber 300A. Similarly, the varying of the distance of air gap(s) between the multiple layers 305 will also affect the electrical properties of the matching network hybrid EMC absorber 300A.

FIG. 3B is a system diagram illustrating a side view perspective of the matching network hybrid EMC absorber 300A of the FIG. 3A, shown in the FIG. 3B as a matching network hybrid EMC absorber 300B. The FIG. 3B shows a number of coated portion(s) 301 in substantially tear drop shapes. Clearly, in various embodiments of the invention, the shapes of the coated portion(s) 301 are of other shapes as well. The coated portion of the outer surface frontside 311 and the coated portion of the outer surface backside 312, as well as the coated portion of the inner surface frontside 321 and the coated portion of the inner surface backside 322, are all visible from the side view perspective of the matching network hybrid EMC absorber 300A, shown as the matching network hybrid EMC absorber 300B.

Figure 4:
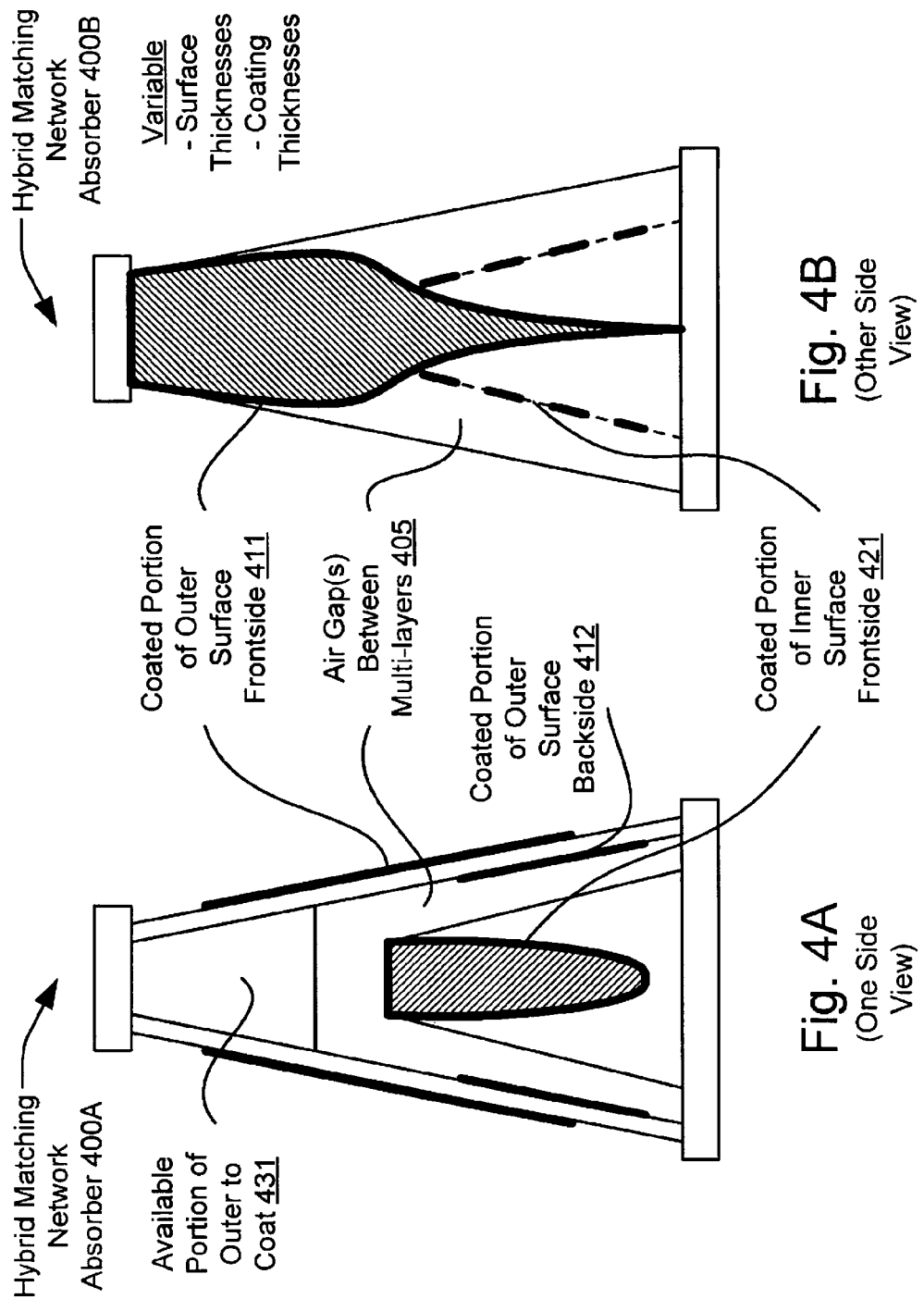
FIG. 4A is a system diagram illustrating another embodiment of a matching network hybrid EMC absorber built in accordance with the present invention from a side view.
FIG. 4B is a system diagram illustrating an other side view perspective of the matching network hybrid EMC absorber of the FIG. 4A.

FIG. 4A is a system diagram illustrating another embodiment of a matching network hybrid EMC absorber 400A built in accordance with the present invention from one side view. The matching network hybrid EMC absorber 400A is shown as being a substrate having multiple layers, each of substantially pyramid-like shape. From certain perspectives, the multiple layers are viewed as being a big element and a small element. One of the layers has a substantially flat top, and the multiple layers are placed one on top of each other and separated by an air gap between the multiple layers 405. In this embodiment, two different of the multiple layers are shown, and there is a single air gap between the multiple layers 405, but clearly in embodiments of the present invention with more than two layers, even more air gaps may be employed. The outer surface of the matching network hybrid EMC absorber 400A is shown as having a first thickness. On this outer surface, there is a coated portion of an outer surface frontside 411 and a coated portion of an outer surface backside 412.

In addition, the matching network hybrid EMC absorber 400A has a coated portion of an inner surface frontside 421. While not used in this particular embodiment, a coated portion of the inner surface backside could be used as well in various embodiments of the invention. There is also shown on the outer surface an available portion of the outer surface to coat 431. If desired in certain embodiments of the invention, this portion also includes a coating to affect the electrical properties of the matching network hybrid EMC absorber 400A.

The thickness of each of the layers of the matching network hybrid EMC absorber 400A is one design parameter, and the distance of air gap(s) between the multiple layers 405 is yet another design parameter. The varying of the thickness of the various multiple layer surfaces will affect the electrical properties of the matching network hybrid EMC absorber 400A. Similarly, the varying of the distance of air gap(s) between the multiple layers 405 will also affect the electrical properties of the matching network hybrid EMC absorber 400A.

FIG. 4B is a system diagram illustrating an other side view perspective of the matching network hybrid EMC absorber 400A of the FIG. 4A, shown in the FIG. 4B as a matching network hybrid EMC absorber 400B. The FIG. 4B shows a coated portion in a substantially tear drop shape. Clearly, in various embodiments of the invention, the shapes of the coated portions may be of other shapes as well. The coated portion of the outer surface frontside 411 and the coated portion of the inner surface frontside 421 are visible from the other side view perspective of the matching network hybrid EMC absorber 400A, shown as the matching network hybrid EMC absorber 400B.

Again, there are various parameters that may be used by a designer of the matching network hybrid EMC absorber 400A (and the matching network hybrid EMC absorber 400B) to control its electrical properties. The surface thicknesses of the multiple layers and the coating thicknesses are two such parameters that may be varied. Moreover, any of the number of coating parameters shown in the FIG. 1 including the coating shape 102, the coating type 103, the coating thickness 104, the coating placement 105, the surface thickness 106, the multiple surface layers 107 or the any other coating parameter 109 are also parameters that are variable to control the electrical properties.

Figure 5:
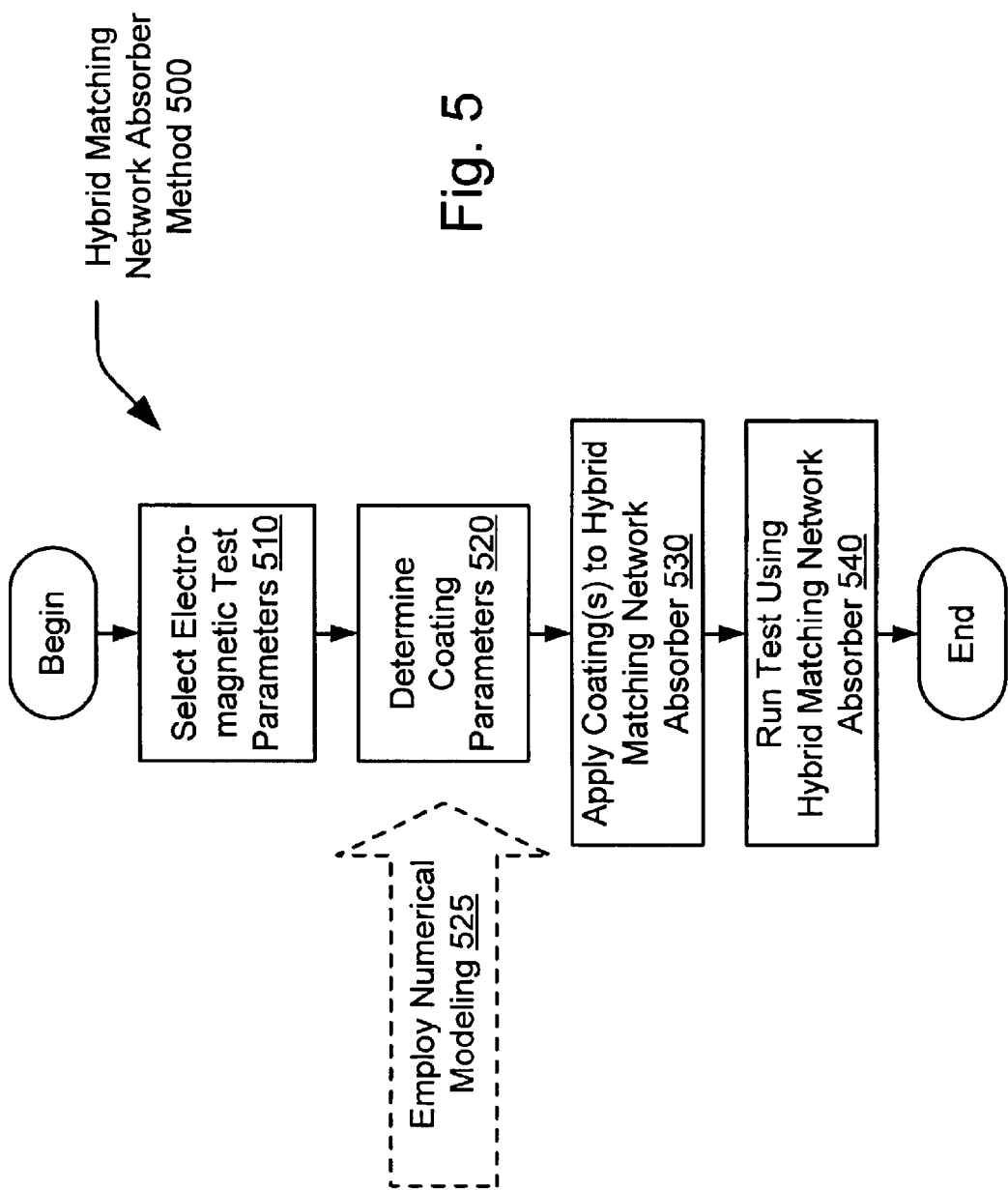
FIG. 5 is a functional block diagram illustrating an embodiment of a matching network hybrid EMC absorber method performed in accordance with the present invention.

FIG. 5 is a functional block diagram illustrating an embodiment of a matching network hybrid EMC absorber method 500 performed in accordance with the present invention. In a block 510, electro-magnetic test parameters are selected. If desired, numerical modeling is employed in a block 515 to determine the coating parameters. Any of the coating parameters in the FIG. 1 include coating parameters that may be used in the operations of the blocks 510 and 515 as shown in the FIG. 5. In a block 520, coating parameters are determined for coating of a matching network hybrid EMC absorber. In a block 530, any number of coating(s) are applied to the matching network hybrid EMC absorber. Then, in a block 540, a test is run using the matching network hybrid EMC absorber.

Figure 6:
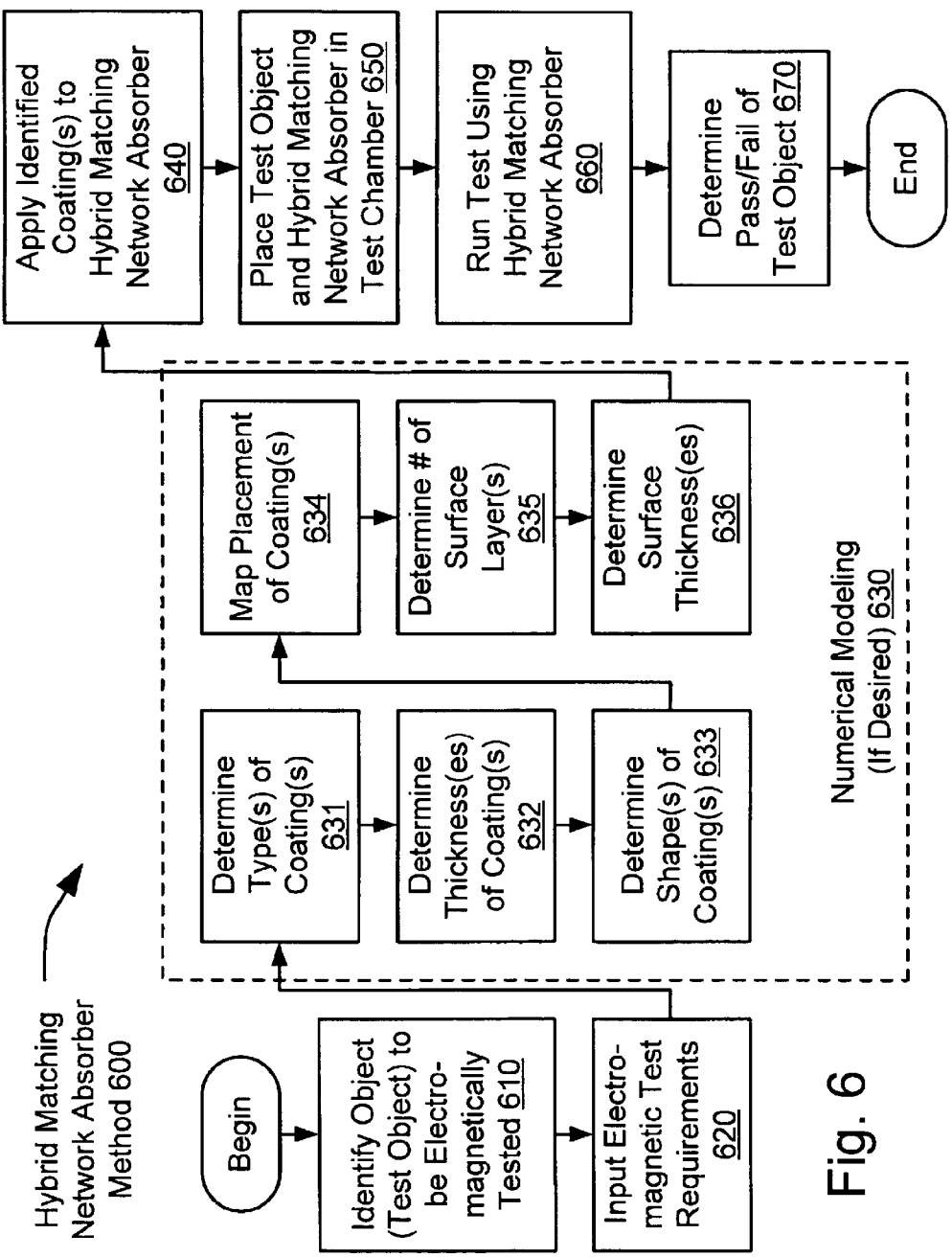
FIG. 6 is a functional block diagram illustrating another embodiment of a matching network hybrid EMC absorber method performed in accordance with the present invention.

FIG. 6 is a functional block diagram illustrating another embodiment of a matching network hybrid EMC absorber method 600 performed in accordance with the present invention. In a block 610, an object, such as a test object, is identified that is to be electro-magnetically tested. Subsequent to the identification of the test object in the block 610, the particular electro-magnetic test requirements are input in a block 620.

If desired, a number of subsequent operations in the FIG. 6 are performed using numerical modeling. In a block 631, type(s) of coating(s) are determined. As few as one type of coating may be used, and clearly, any number of types of coatings may also be used. In certain embodiments of the invention, a first material is used for one coated portion of a matching network hybrid EMC absorber and a second material is used for another coated portion of the matching network hybrid EMC absorber in the matching network hybrid EMC absorber method 600. In a block 632, the thickness(es) of the coating(s) are then determined. A single coating thickness may be used if desired. In a block 633, the shape(s) of the coating(s) are determined. Similarly, as few as one type of shape may be used. In a block 634, the placement of the coating(s) are mapped. Similarly, as few as one placement for all coatings may be used on one or all of multiple surfaces or layers of a matching network hybrid EMC absorber. In a block 635, the number of surface layer(s) is determined. A single layer may be used. A big element and a small element may be used. Any number of surface layers may be used in various embodiments of the invention. In a block 636, the surface thickness(es) are determined. As mentioned above, the operations in the blocks 631–636 are all performed individually, or cooperatively, using numerical modeling.

Subsequently, the coating(s) identified in the preceding blocks are applied to the matching network hybrid EMC absorber in a block 640. As mentioned above, any number of coating may be used. Any variety of shapes of coatings may be used. As few as a single type of coating and a single shape may be used in certain embodiments of the invention. The combination of parameters governing the coating of the matching network hybrid EMC absorber that are ultimately identified will be used during the application of the coating (s) to the matching network hybrid EMC absorber in the block 640. After the coating(s) have been placed on the matching network hybrid EMC absorber, then in a block 650, the matching network hybrid EMC absorber and the test object identified in the block 610 are placed into a test chamber. Then, in a block 660, a test is run using the matching network hybrid EMC absorber. After the test has been run, then in a block 670, it is determined whether the test object has passed or failed the test. Any number of qualification criteria are used in various embodiments of the invention to determine whether the test object has passed or failed the test run in the block 660.

In view of the above detailed description of the present invention and associated drawings, other modifications and variations will now become apparent to those skilled in the art. It should also be apparent that such other modifications and variations may be effected without departing from the spirit and scope of the present invention.

What is claimed is:

1. A matching network hybrid electro-magnetic compatibility absorber to provide improved radio frequency absorbing performance in a frequency range of approximately 20 MHz to approximately 500 MHz, comprising:

a big element;

a small element that is located beneath the big element;

the big element comprises a big element surface;

the small element comprises a small element surface;

a big element coating that covers a predetermined portion of the big element surface; and a small element coating that covers a predetermined portion of the small element surface.

2. The matching network hybrid electro-magnetic compatibility absorber of claim 1, wherein the matching network hybrid electro-magnetic compatibility absorber comprises a substantially pyramid-like shape;

the predetermined portion of the big element surface comprises less than an entirety of the big element surface; and the predetermined portion of the small element surface comprises less than an entirety of the small element surface.

3. The matching network hybrid electro-magnetic compatibility absorber of claim 1, wherein at least one of the big element coating and the small element coating comprises a substantially tear drop shape.

4. The matching network hybrid electro-magnetic compatibility absorber of claim 1, wherein at least one of the big element coating and the small element coating comprises a predetermined thickness.

5. The matching network hybrid electro-magnetic compatibility absorber of claim 1, wherein the big element and the small element are separated by a predetermined distance.

6. The matching network hybrid electro-magnetic compatibility absorber of claim 1, wherein the big element comprises at least two surfaces; and a distance between the at least two surfaces comprises a predetermined thickness.

7. The matching network hybrid electro-magnetic compatibility absorber of claim 1, wherein the big element coating comprises a first material; and the small element coating comprises a second material.

8. The matching network hybrid electro-magnetic compatibility absorber of claim 1, further comprising at least one additional big element coating that covers at least one additional predetermined portion of the big element surface, the at least one additional predetermined portion of the big element surface being less than an entirety of the big element surface.

9. A matching network hybrid electro-magnetic compatibility absorber, comprising:

an absorber comprising a surface having a coating;

the coating having a coating shape;

wherein the coating shape is varied as a design parameter to permit absorption of radio frequency energy in a frequency range extending from approximately 500 MHz to approximately 40 GHz, and the coating shape comprises a substantially tear drop shape.

10. The matching network hybrid electro-magnetic compatibility absorber of claim 9, wherein the coating covers less than an entirety of the surface.

11. The matching network hybrid electro-magnetic compatibility absorber of claim 9, wherein the surface comprises at least one additional coating that comprises at least one of at least one additional coating type, at least one additional coating shape, at least one additional coating thickness, and at least one additional coating placement.

* * * * *